United States Patent [19]
Chang et al.

[11] Patent Number: 5,857,061
[45] Date of Patent: Jan. 5, 1999

[54] POWER WINDOW SWITCH WHICH INCORPORATES EXPRESS UP/DOWN AND WINDOW MOTOR SPEED CONTROL FEATURES USING A FORCE SENSITIVE RESISTOR OR CAPACITOR

[75] Inventors: Albert Y. Chang, Brookfield; Michael G. Taranowski, Greendale; Brian T. Pier, Milwaukee; James E. Hansen, Oak Creek; Ruth E. Hubbell, Milwaukee; Lewis J. Gohde, Sussex; Edward J. Hummelt, Wauwatosa; Richard A. Baumann, Franksville; Peter J. McGinnis, Brookfield; Arlene M. Klumb, Richfield, all of Wis.

[73] Assignee: Eaton Corporation, Cleveland, Ohio

[21] Appl. No.: 789,048

[22] Filed: Jan. 28, 1997

[51] Int. Cl.$^6$ ............................................. H02P 7/29
[52] U.S. Cl. ........................ 388/829; 388/840; 318/280; 318/446; 49/140
[58] Field of Search ................. 318/280–300, 318/445–489; 49/31, 139–140, 280; 388/800–841, 915

[56] References Cited

U.S. PATENT DOCUMENTS 3,710,050  1/1973  Richards .................................. 180/111
3,830,018  8/1974  Arai et al. ................................. 49/28

*Primary Examiner*—David Martin
*Attorney, Agent, or Firm*—Roger A. Johnston

[57] ABSTRACT

A system for enabling a vehicle operator to control the speed or rate of raising and lowering of a powered lift window. The actuator or switch includes a pressure responsive variable impedance device comprising a variable resistance in one embodiment and a variable capacitance in another embodiment. Increasing force directly on the variable impedance device by the user's finger or an actuator decreases the impedance which is sensed by a voltage divider which outputs a voltage which increases with increasing force. This latter voltage is compared with the output of a triangle wave oscillator and the output of the comparator is a pulse width modulated signal with pulse-width proportional to applied force. The pulses are applied to a power device (Mosfet) which modulates the duty cycle (%) of the current to the window lift mechanism drive motor to give variable motor speed.

11 Claims, 9 Drawing Sheets

POWER WINDOW SWITCH WHICH INCORPORATES EXPRESS UP/DOWN AND WINDOW MOTOR SPEED CONTROL FEATURES USING A FORCE SENSITIVE RESISTOR OR CAPACITOR

BACKGROUND OF THE INVENTION

The present invention relates to an automotive control device and, in particular, a control employed on a vehicle to enable the vehicle operator to control servo motors operative to raise and lower the windows in the vehicle. Typically, motor vehicles have a pushbutton- or rocker-actuated switch provided on a console, commonly mounted on the inside of the door, to enable the vehicle operator or passengers to selectively activate motors for raising or lowering a particular window or any combination of windows. The window motors are each activated by a relay energized by the operator pushing the button on the console. Heretofore, with relays energizing the window motors, the motor could only be operated at full voltage from the onboard vehicle power supply or left in the "off" state, e.g., the switch was an "on/off" device.

It has been desired to provide a way or means of providing a variation in the speed or rate at which a window is raised or lowered. Where it is desired to set the window at a certain position, or opened only a relatively small amount for providing a desired amount of ventilation, it has been found difficult to accurately position the window because of the relatively high rate at which the motor raises and lowers the window. In such instances, the vehicle operator or passenger, as the case may be, would experience difficulty in energizing the motor for a sufficiently limited time to prevent overrunning of the desired window position. Thus, in this mode of operation, it has been desired to have a slower rate of raising and lowering to enable accurate window positioning. On the other hand, when it is necessary to provide an immediate raising or lowering of the window (for example, to prevent intrusion or entry of wind, smoke, dust or rain), it is desired to retain the higher rate of raising or lowering. It, thus, has been desired to provide a way or means of varying the rate of raising or lowering vehicle windows which is simple and easy for the operator to use and, of course, a way to accomplish this function which is low in cost and easily installed in mass production of vehicles.

BRIEF SUMMARY OF THE INVENTION

It is an object of the present invention to provide a vehicle-powered window lift control system which has a variable rate of raising and lowering the vehicle windows and which is readily and easily controllable by the vehicle operator.

It is a further object of the present invention to provide a variable vehicle-powered window lift system which has the rate of raising or lowering increased by the vehicle operator pressing on a button or control input device or switch with greater force.

It is a further object of the present invention to provide a variable vehicle-powered window lift control system in which the rate of raising and lowering of the window is increased by the operator changing the impedance of the input device or switch by increased pressure.

The present invention employs in one embodiment a device which employs variable resistance, sensitive to the applied force, which resistance is decreased by the user manually pressing harder or with greater force on the input device or switch which change in resistance is electrically detected to modulate the speed of the powered window lift motor.

In another embodiment, increasing user pressure on the input device or switch increases the capacitance of the force sensitive switch which is electrically detected to modulate the window lift motor speed.

DETAILED DESCRIPTION OF THE INVENTION

Figure 1:
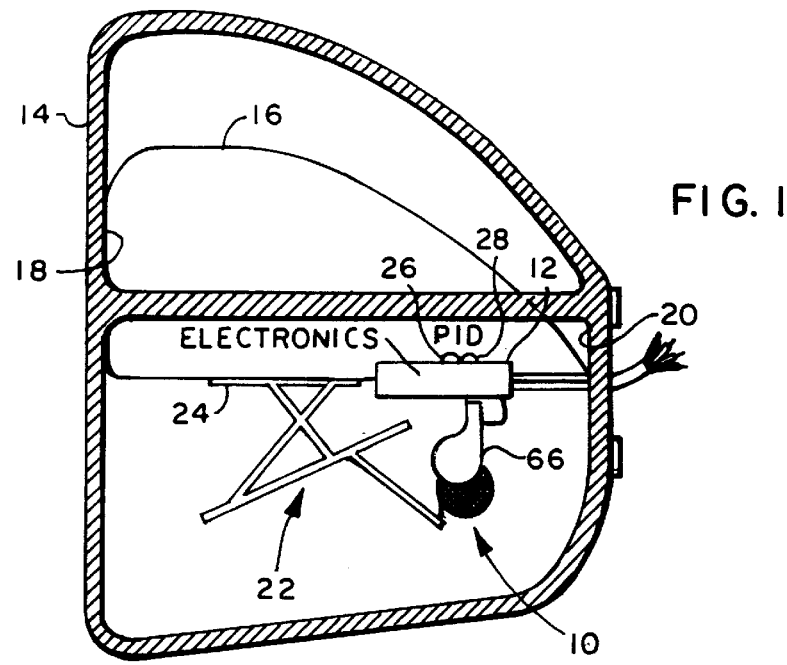
FIG. 1 is a diagram of the powered window lift control system of the present invention installed in a vehicle door.
Figure 6A:
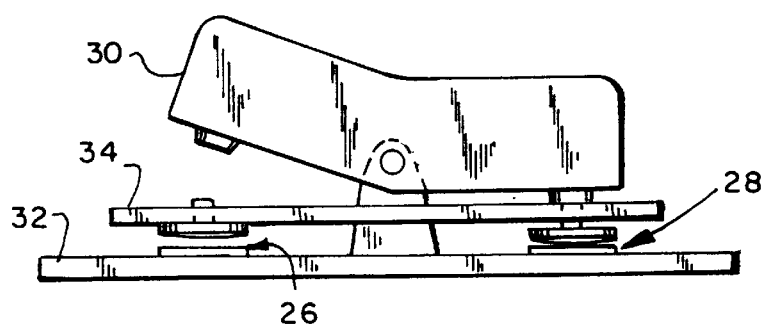
FIG. 6a is a view of the force sensitive variable impedance switch with actuator.
Figure 6B:
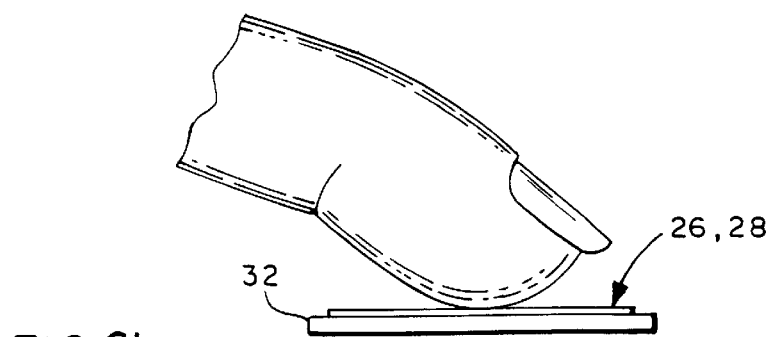
FIG. 6b is a view of the force sensitive variable impedance switch directly actuated by the user.

Referring to FIGS. 1, 6a and 6b, the system of the present invention is indicated generally at 10 and has a control console 12 on a vehicle door 14 with a window 16 raised and lowered in tracks 18, 20 by a motorized mechanism indicated generally at 22, connected to a window channel 24. At least one, and typically for a driver's door a plurality, of user input controls or variable impedance devices 26, 28 are provided on console 12. Each of the devices indicated generally at 26, 28 may have an actuator 30 which is directly acted upon or receives a force input from the vehicle operator or driver's hand or fingers such as, for example, a pushbutton-type (not shown) actuator provided on the console 12. The actuator 30 imparts a force on one of the pressure-responsive variable impedance devices 26, 28 situated on a base or supporting structure 32, which forms a part of console 12. A rocker-type actuator 30 is shown in FIG. 6a which acts upon a bar 34 which presses on devices 26, 28. Alternatively, the devices 26, 28 may be acted upon directly by the user's finger as shown in FIG. 6b. It will be understood that other types of actuators may be employed, as for example, by eliminating rocker 30 and applying user force directly to bar 34.

In one embodiment of the invention, devices 26, 28 comprise a force sensitive resistive device which provides decreasing electrical resistance with increasing pressure from bar 34. In another embodiment of the invention as will be described hereinafter in greater detail, a variable capacitor is employed to provide an increased capacitance with increased force input.

Figure 2:
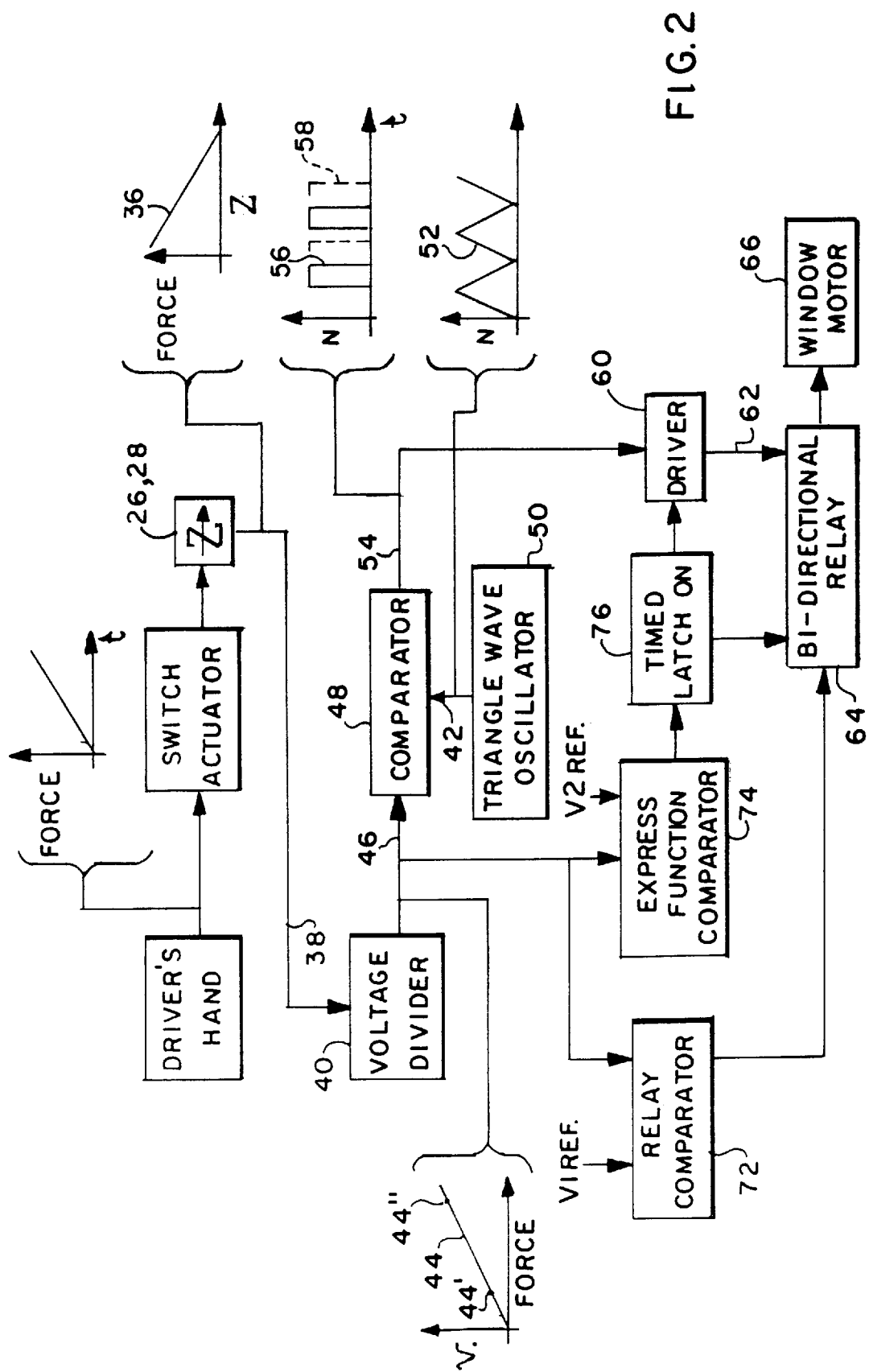
FIG. 2 is a block diagram of the system of FIG. 1 employing a force sensing variable resistive switch.

The force-versus-impedance signal characteristics of the devices 26, 28 are indicated graphically at 36 in FIG. 2.

Referring to FIG. 2, The devices 26, 28 are connected along line 38 to a voltage divider network 40. The voltage divider network 40 is operative to sense the variable impedance of the devices 26, 28 and to convert it to a voltage signal increasing with force, as indicated graphically at 44 and provided at the output line 46. A low-level force signal is indicated at 44' and a high force level signal is indicated at 44" in the graphical representation of the voltage 44.

The output of the voltage divider 40 is connected along line 46 to the input of the comparator 48, which receives at another input along line 42 the output of a triangle wave oscillator 50 having an output as shown graphically at 52 in FIG. 2. The output of the comparator 48 along line 54 is indicated graphically as a series of pulses shown in solid outline at 56 for the voltage signal 44' for a low force input, and in dashed line at 58 for the voltage signal 44" for a high force input as compared with the output signal 52 of the triangle wave oscillator. The output of this variable impedance devices 26, 28 is thus converted to a pulse-modulated (PWM) signal.

The output of the comparator 48 along line 54 is connected to the input of a power driver device or driver 60, such as a Mosfet device, which provides a modulated driver signal along its output line 62 to a bi-directional motor relay 64 which operates the window lift motor 66.

Figure 3A:
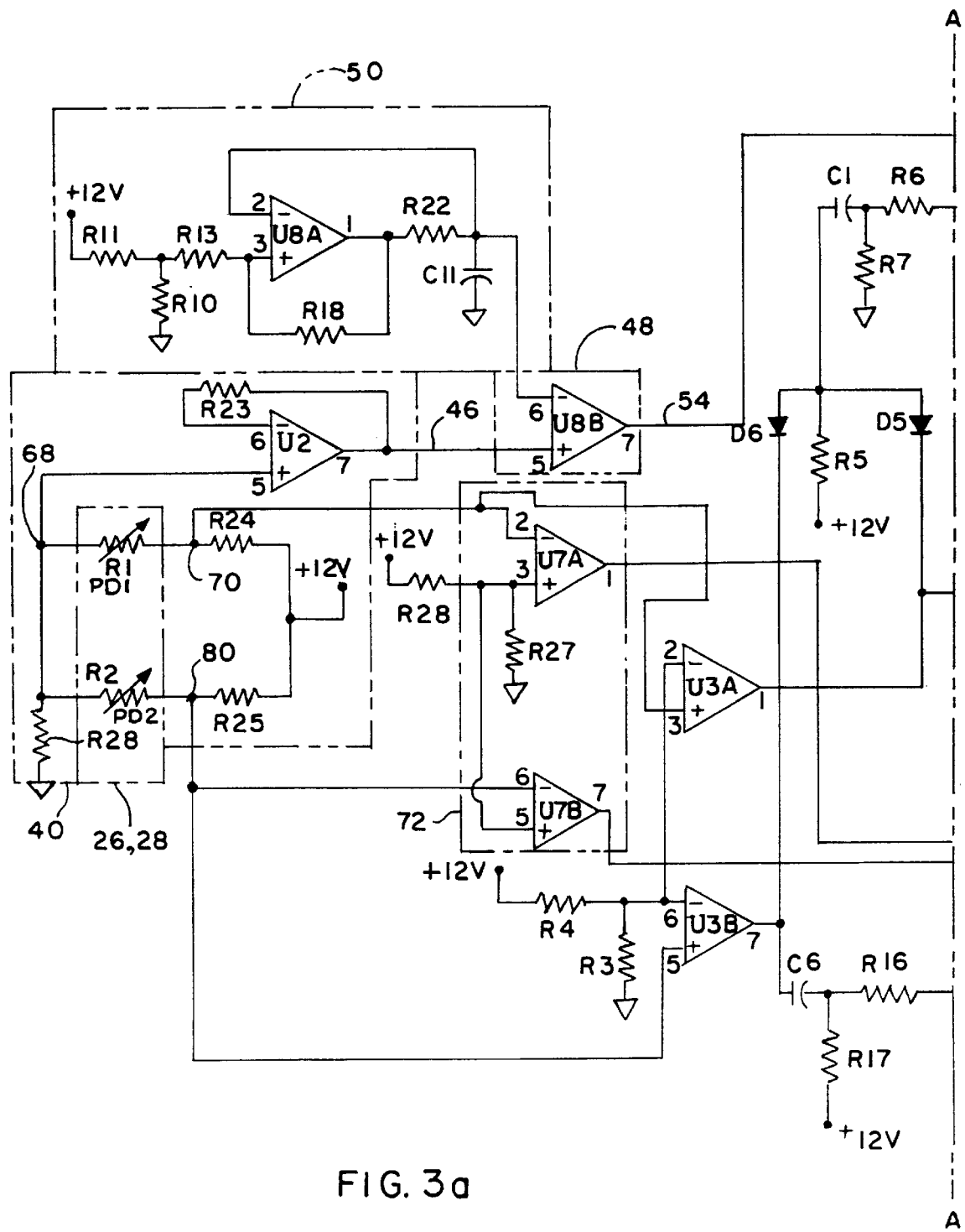
FIG. 3a is the lefthand portion of an electrical schematic of the system of FIG. 2 divided along parting line A—A.
Figure 3B:
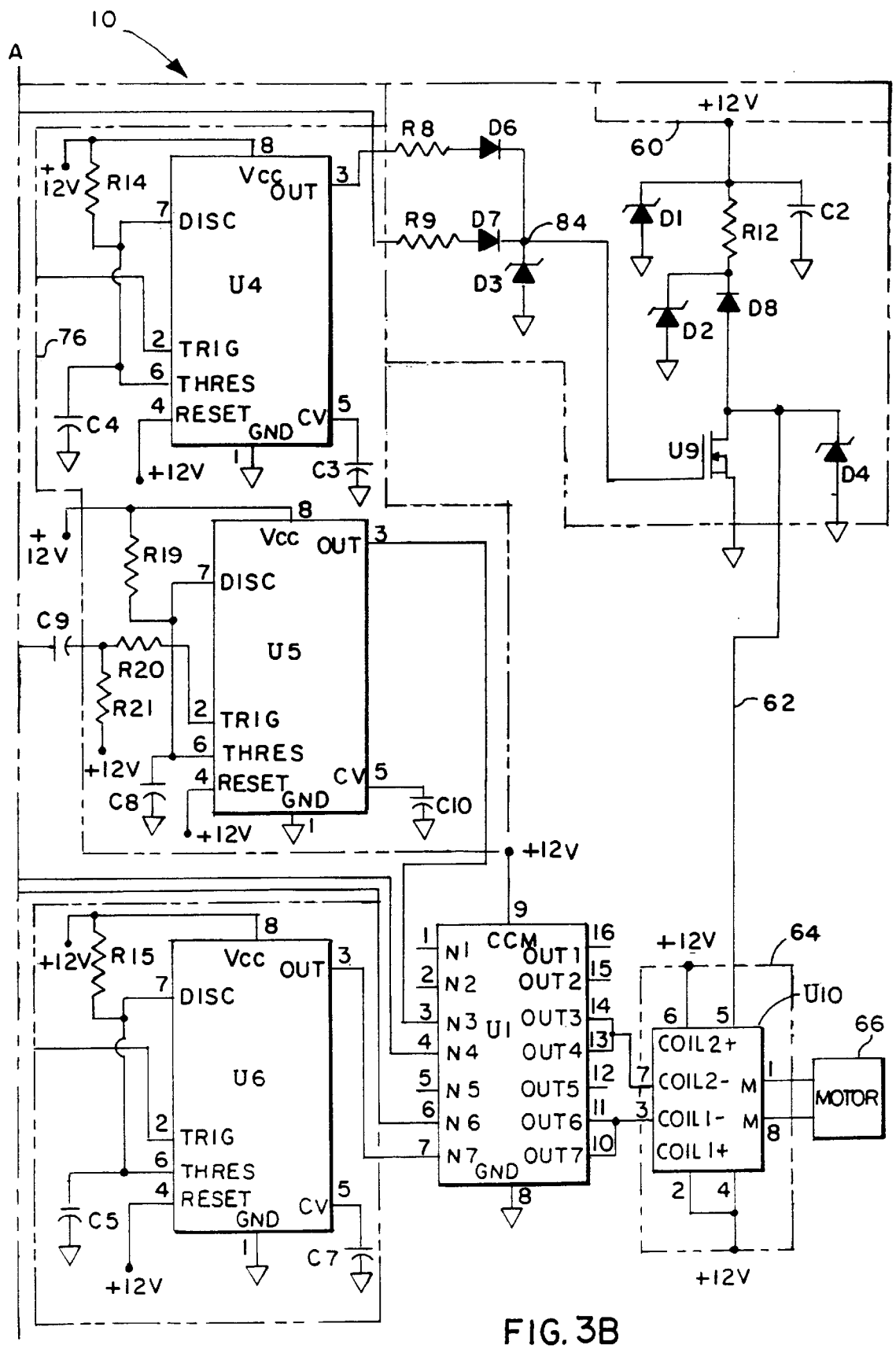
FIG. 3b is the righthand portion of the schematic of FIG. 3a divided along parting line A—A.

Referring to FIGS. 3a and 3b, in the embodiment 10 of the invention, the variable impedance devices 26, 28 comprise separate variable-resistance, force-sensitive resistors PID1 and PID2 comprising resistors R1 and R2, respectively, connected in parallel and having the resistance values R1, R2 in the present practice of the invention of about 3–4 kilo ohms in the fully actuated state, i.e., with maximum force applied thereto. Devices PID1 and PID2 are preferably formed of force transducer ink with polymer film conductors.

Referring to FIG. 6a, the devices 26, 28 have a force impressed thereon by switch actuator 34 and rocker 12 upon the driver pushing on the rocker actuator 30 associated with the individual device. Alternatively, the driver may apply finger pressure directly to the devices 26, 28, as shown in FIG. 6b.

Such force sensitive resistance devices are known and commercially available, such as that supplied by Interlink Electronics, Inc., Camorillo, Calif. and shown and described in U.S. Pat. No. 5,302,936.

Referring to FIGS. 3a and 3b, the signal processing of the circuitry is set forth below with respect to various modes of operation of the powered window lift system of the embodiment 10. As applied pressure increases on PID 1 or PID 2, the voltage at junction 68 increases. U 2 amplifies this signal and produces an increasing voltage at U8B-5. This signal, combined with the output from the 1 kHz triangle wave oscillator inputted at U8B-6, yields a pulse-width modulated signal at U8b-7. This voltage controls the duty cycle of the signal produced at U 8 B-7. Then, this PWM signal controls the gate of the U 9 Mosfet, producing this same signal at U 10-5. This PWM signal is seen on the relay at U 10-5. Also, this PWM signal is seen by the motor, and the speed will increase proportionately in response to the applied PID pressure, and the window speed controlled by the motor speed will follow exactly.

When PID1 is pressed, the voltage at junction 70 decreases proportionately with the applied force. When this voltage falls below $V1_{REF}$, which in the present practice of the invention is chosen as 9 volts, the relay comparator 72 is activated: U 7 A-1 goes high and U 1–13 goes low, thus energizing U 10 relay coil 78 through pin 7 thereof. The motor speed responds to the PWM signal and the window moves up at a speed determined by the amount of force applied at the PID. The motor speed increases with increasing duty cycle.

When the voltage at junction 70 falls below $V\ 2_{REF}$, which in the present practice of the invention is chosen as 5 volts, the "express" function comparator 74 is activated: the output of U 3 A-1 goes low, then the timed latch "on" function 76 is energized: U5 timing sequence starts, producing a 12-volt pulse of a 3-second duration at U 5-3. This inverts at U 1-14 and energizes the U 10 relay coil 78 at pin 7. In addition, that signal from U 3A pulls the diode D5 low and starts another timing sequence out of U 4-3 of a 3-second duration. This signal then gates the U 9 Mosfet "on" for that 3-second duration. When the Mosfet is "on," the signal at U 10-5 is grounded. Therefore, a full +12 volts is applied across the motor leads, yielding maximum window speed in the "up" direction; thus, the "express up" mode is activated.

Figure 4:
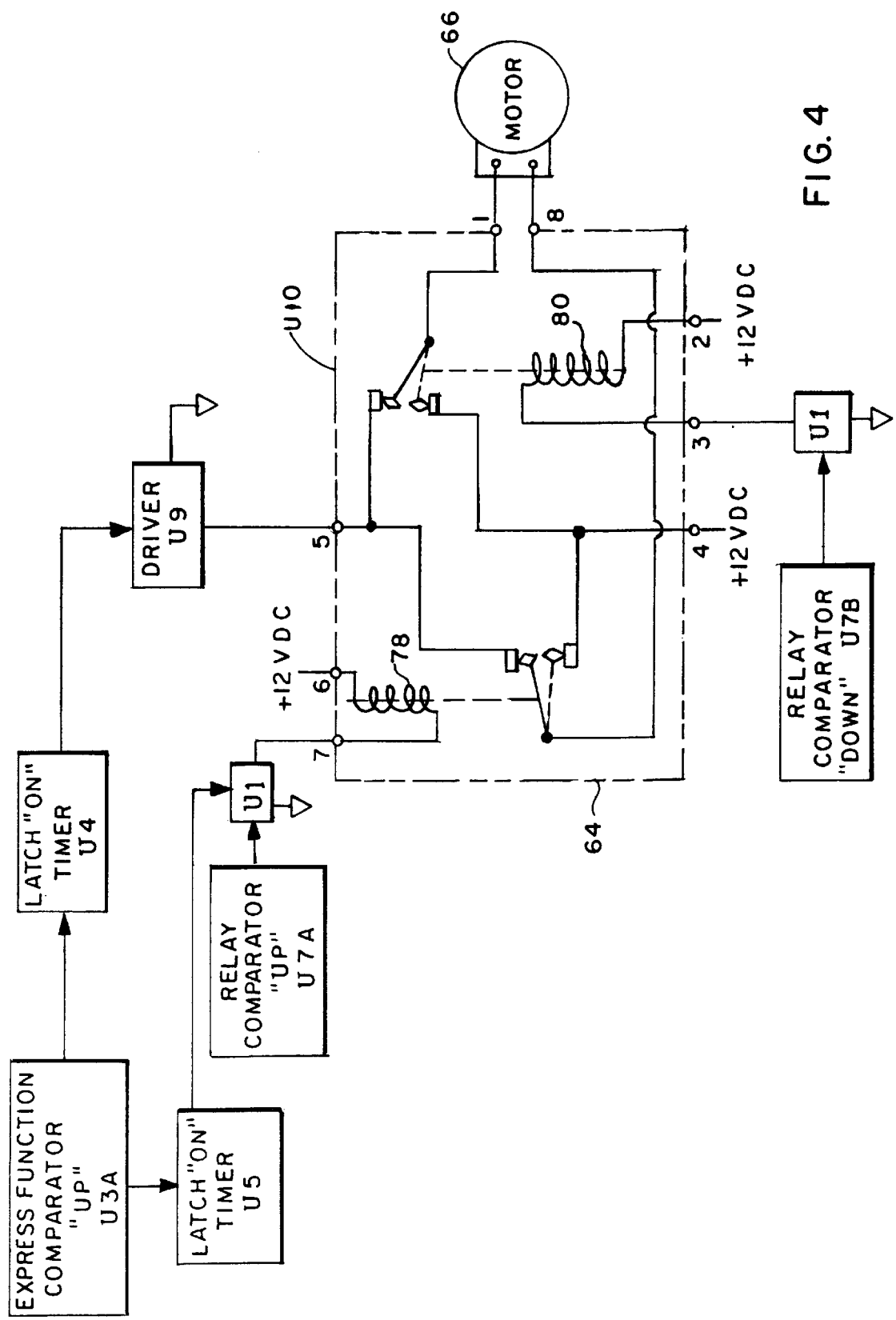
FIG. 4 is a schematic of the motor relay for the system of FIG. 2.

Referring to FIG. 4, when U 9 grounds pin 5 of relay U 10, one side of the motor is at ground potential at one of pins 1 and 8 of U 10, and if either "up" coil 78 or "down" coil 80 is energized by U 1, full voltage is then applied from pin 4 of U 10 to the opposite side of the motor through the other of pins 1 and 8.

When PID 2 is pressed, the voltage at junction 80 decreases proportionately with the applied force. When this voltage falls below $V\ 1_{REF}$ (i.e., 9 volts), the relay comparator 72 (i.e., U 7 B-7) goes high and U 1-11 goes low, thus energizing U 10 relay coil 80 through pin 2 thereof. The motor polarity is thus reversed, the motor speed responds to the PWM signal from U 9 and pin 5, and the window moves down at a speed determined by the amount of force applied at the PID. The motor speed increases with increasing duty cycle.

When the voltage at junction 80 falls below $V\ 2_{REF}$, which in the present practice of the invention is chosen as +5 volts, then comparator 74 by U 3 B sends out a pulse triggering the U 6 timing sequence of 3-second duration. This signal inverts at U 1-10 and energizes the U 10 relay coil 80 for that 3-second duration. In addition, that signal from U 3 B-7 pulls the diode D6 low and starts another timing sequence out of U 4-3 of a 3-second duration. This signal then gates the U 9 Mosfet "on" for that 3-second duration. When the Mosfet is "on," the signal at U 10-5 is grounded, grounding one side of the motor through pin 8. Therefore, a full +12 volts is applied across the motor leads through pin 1 of U 10, yielding maximum window speed in the "down" direction, thus the "express down" mode is activated.

Figure 5A:
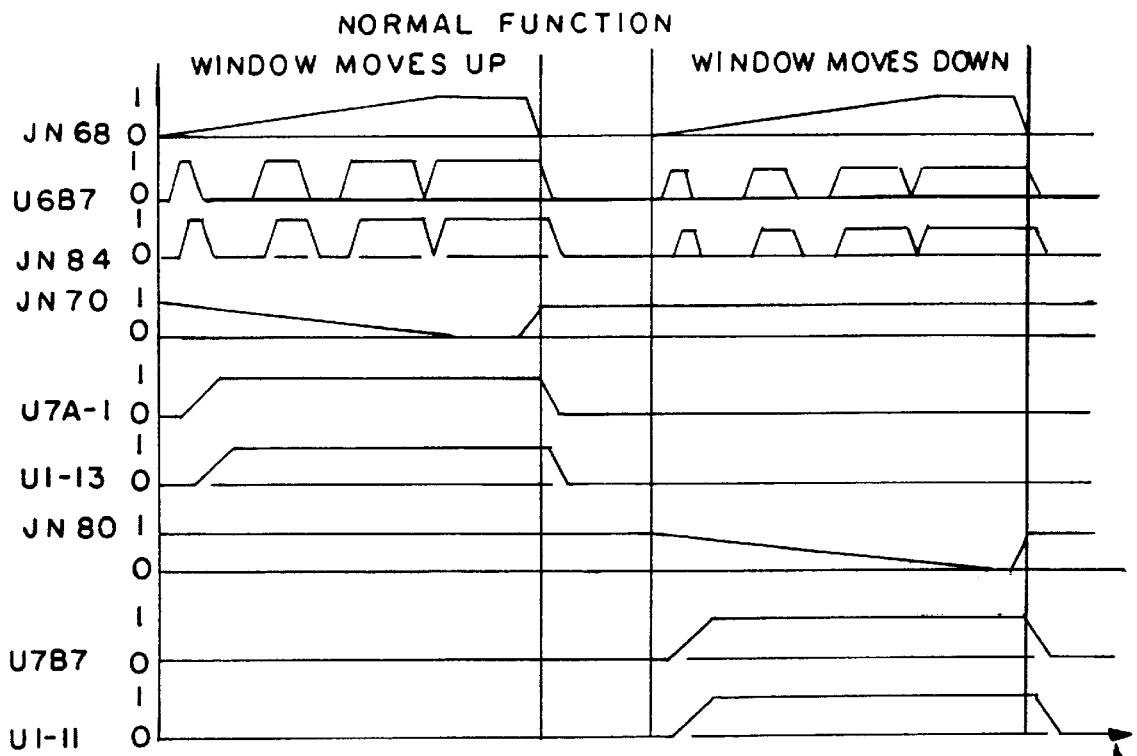
FIG. 5a is a timing diagram of the output of various circuit components of FIGS. 3a and 3b.
Figure 5B:
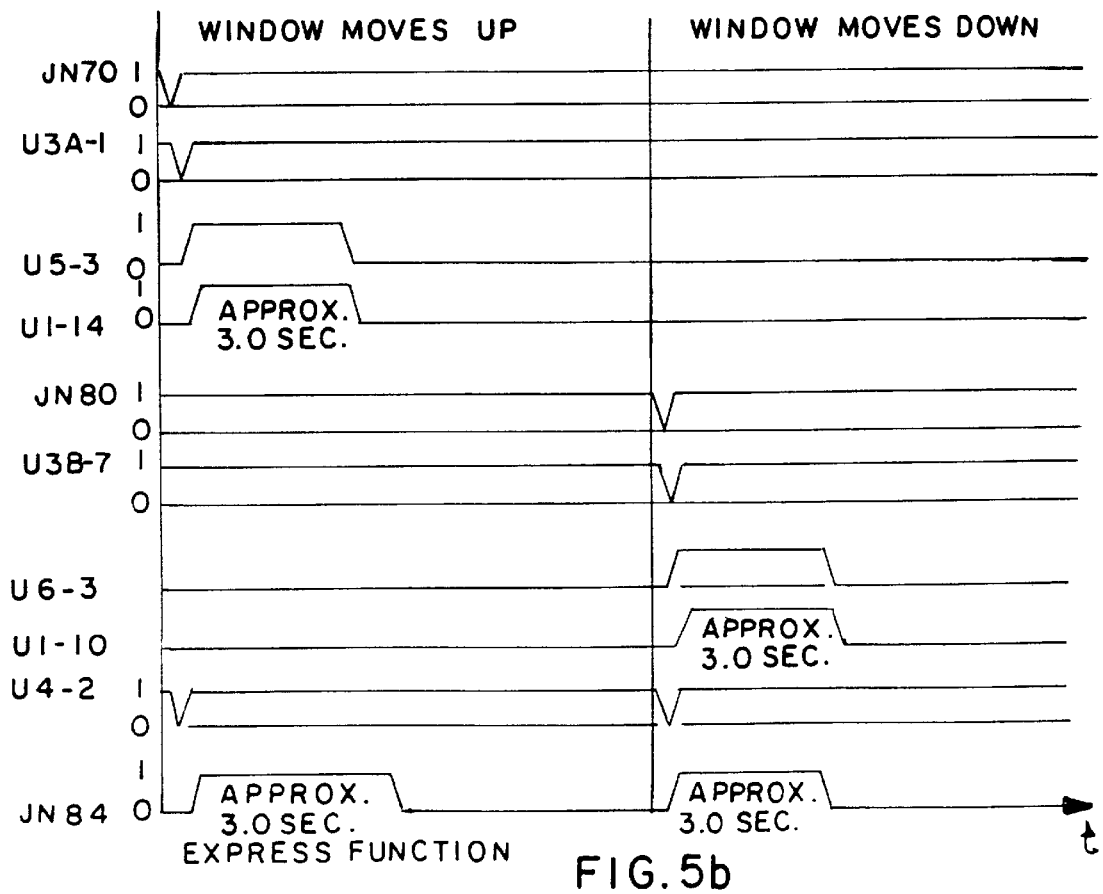
FIG. 5b is a timing diagram, similar to FIG. 5a, for the express function.

The timing of the output of the various devices of the circuit of FIGS. 3a and 3b is shown graphically in FIGS. 5a and 5b for the different modes of operation described above. The values of resistances, capacitances and the integrated circuit device designations for the circuit of FIGS. 3a and 3b are given in Table I below.

TABLE I (FIGS. 3a and 3b)

| R: Ohms | C: µfds | U Type | D Type |
|---|---|---|---|
| 1 - PID1 | 1 - 0.1 | 1 - ULN2003 | 1 - 16 v, Z |
| 2 - PID2 | 2 - 0.1 | 2 - LT1013 | 2 - 24 v, Z |
| 3 - 4.4K | 3 - .01 | 3A - ½LT1013 | 3 - 115 v, Z |
| 4 - 6.0K | 4 - 0.4 | 3B - ½LT1013 | 4 - 24 v, Z |
| 5 - 10K | 5 - 0.4 | 4 - 1CM7555 | 5 - IN4148 |
| 6 - 5.1K | 6 - 0.1 | 5 - 1CM7555 | 6 - IN4148 |
| 7 - 10K | 7 - .01 | 6 - 1CM7555 | 7 - IN4148 |
| 8 - 10K | 8 - 0.4 | 7A - ½LT1013 | 8 - IN4145 |
| 9 - 10K | 9 - 0.1 | 7B - ½LT1013 | 9 - IN4148 |
| 10 - 10K | 10 - .01 | 8A - ½LT1013 | |
| 11 - 14K | 11 - 1 | 8B - ½LT1013 | |
| 12 - 5.1 | | 9 - RFP50N05 | |
| 13 - 10K | | 10 - EP2 Relay | |
| 14 - 10 Meg | | | |
| 15 - 10 Meg | | | |
| 16 - 5.1K | | | |
| 17 - 10K | | | |
| 18 - 36K | | | |
| 19 - 10 Meg | | | |
| 20 - 5.1K | | | |
| 21 - 10K | | | |
| 22 - 10K | | | |
| 23 - 7K | | | |
| 24 - 320K | | | |
| 25 - 320K | | | |
| 26 - 10K | | | |
| 27 - 9K | | | |
| 28 - 3K | | | |

Figure 7A:
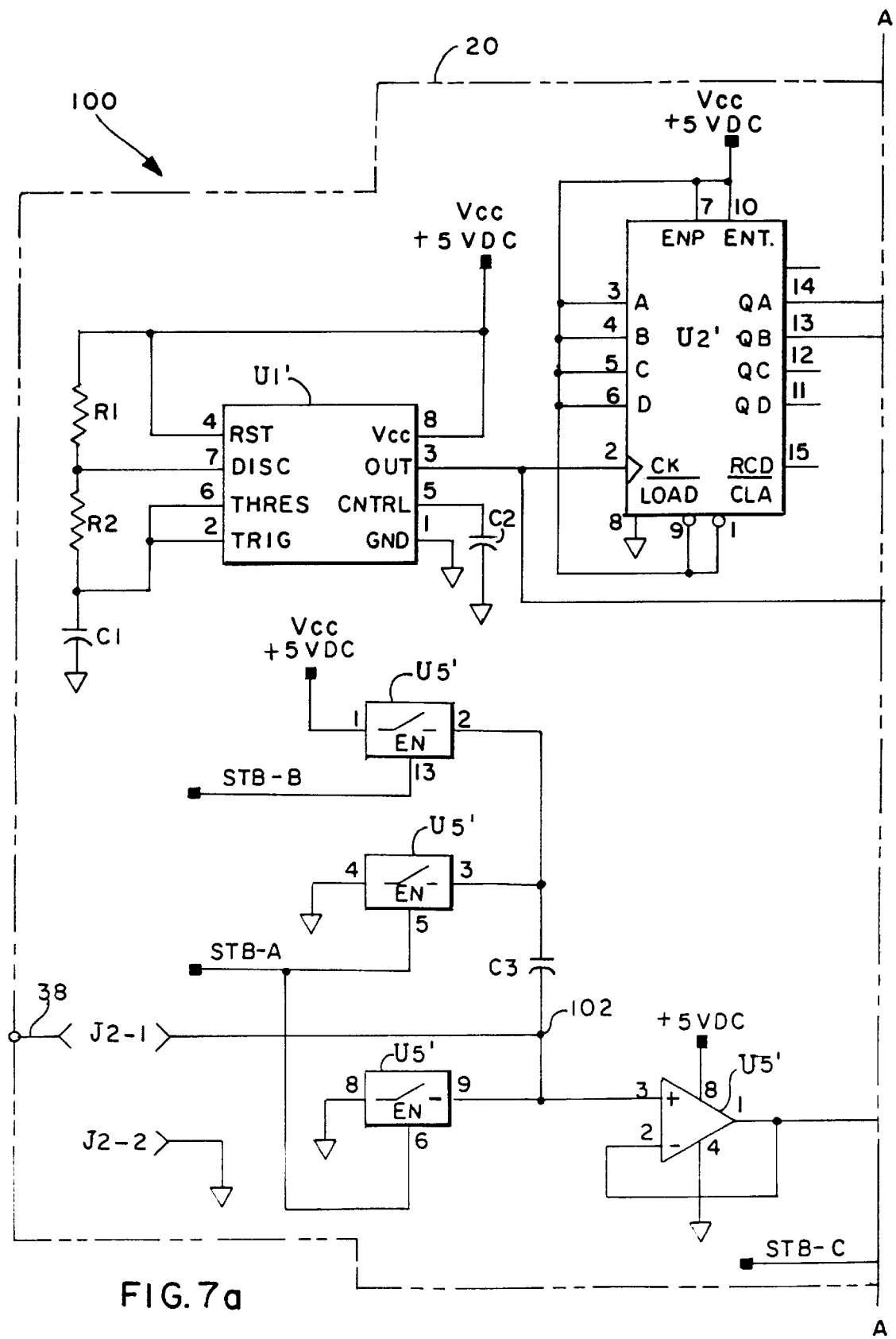
FIG. 7a is the left hand portion of an electrical schematic divided along parting line A—A of an alternate embodiment of the invention of FIG. 2 employing a variable capacitance.
Figure 7B:
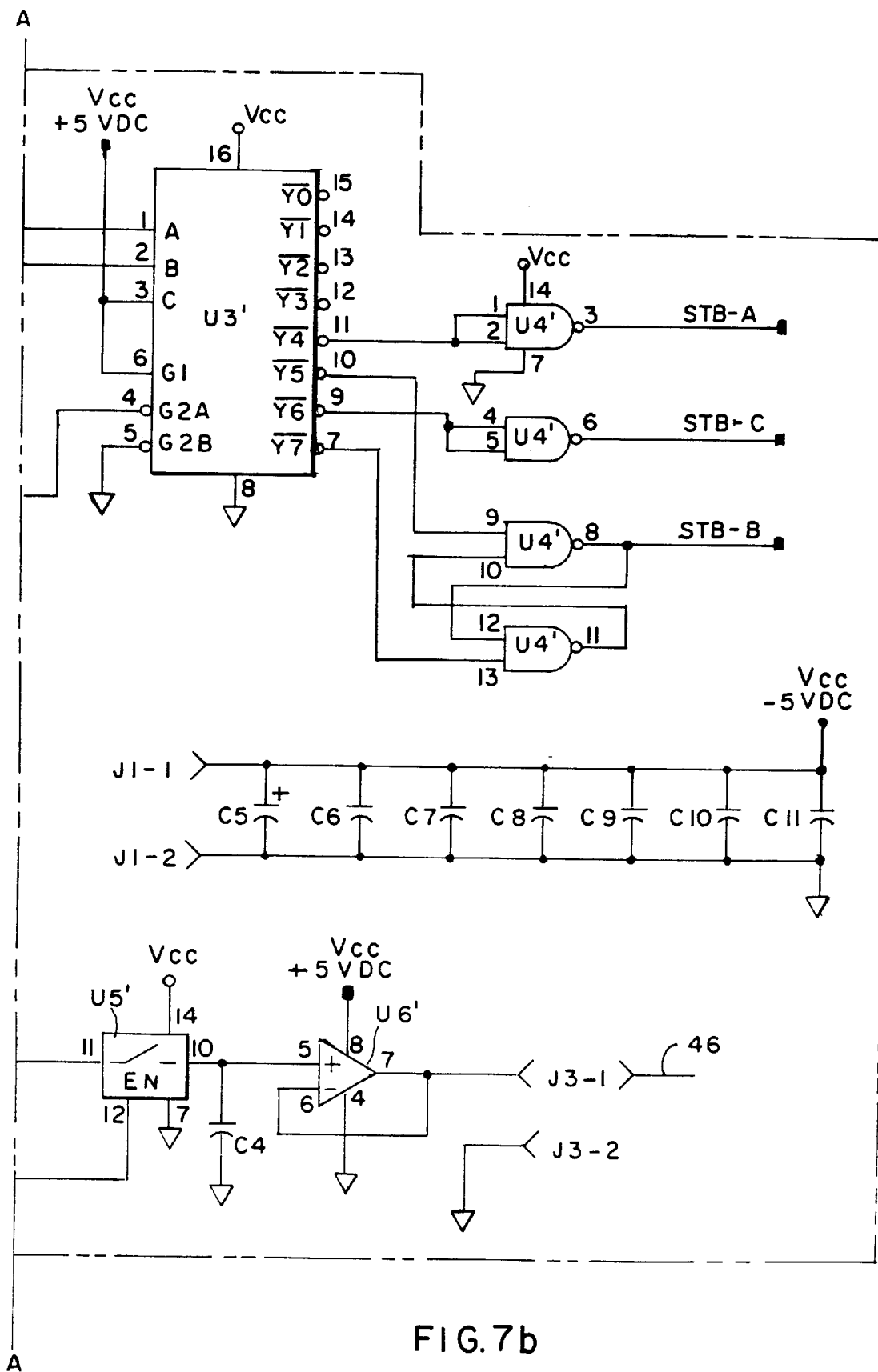
FIG. 7b is the right hand portion of the schematic of FIG. 4a divided along parting line A—A.

Referring to FIGS. 7a and 7b, an alternate embodiment of the invention indicated generally at 100 is illustrated wherein the variable impedance devices 26, 28 comprise a force-responsive, variable capacitance. Variable capacitance switches are known in the art, as for example, the device described in U.S. Pat. No. 5,559,665 may be employed, or any other suitable variable capacitance switch may be used. The variable capacitance device is of relatively thin, flat configuration and, when installed, would have an appearance similar to that shown in FIGS. 6a and 6b.

The embodiment 100 is formed by substitution, for the voltage divider 40 in the system of FIG. 2, the circuit shown in FIGS. 7a and 7b when the variable impedance devices 26, 28 comprise a force-sensitive, variable-capacitance switch.

Referring to FIGS. 7a and 7b, the circuit receives power at connector terminals J1 and provides, through capacitor network comprising capacitors C5 through C11, and the power supply voltage $V_{cc}$ at 5 volts DC. The variable-capacitance-type devices 26, 28 of the embodiment 100 are connected from line 38 at terminals J2. The output signal 44 from the voltage divider 40, comprising a voltage proportional to force applied to the capacitive switch devices 26, 28, is connected through terminal J3 along line 46 to the input of comparator 48.

The impedance of the force-sensitive capacitor devices 26, 28 is measured in a voltage divider circuit. The voltage divider is comprised of a reference capacitor C3 and the switch 26, 28 capacitor to be measured connected in series. The capacitors are simultaneously charged; and, the voltage at the point where the capacitors are connected together, junction 102, indicates the impedance of the capacitor of the devices 26, 28. The logic uses a four step process to measure the capacitive impedance.

Device U1' comprises a square wave oscillator which provides an output at pin 3 thereof to the input of a counter device U2' which counts for valid states and then repeats. The outputs QA and QB of U2' are inputted to a one of eight decoder U3' such that when the most significant bit goes high, QA and QB drive the least significant bit and it rotates through states 4, 5, 6 and 7 by forcing them low.

The four steps of the process are generated by the following digital logic. Oscillator U1' provides a clock pulse to the counter U2'. The first two outputs of the counter, which counts in binary from zero to three, are connected to the first two inputs of U3', a 3:8 decoder which generates four separate sequential pulses. The first and third pulse are inverted by U4' and labeled STB-A and STB-C on the schematic. The second and fourth pulses set and reset respectively a flip-flop formed by the two remaining gates of U4'. This generates the charging control pulse labeled STB-B on the schematic.

In the first step of the impedance measuring process, control pulse STB-A activates analog switches in U5' which are connected to both ends of the capacitor divider. This causes both capacitors to be completely discharged. In the second step, the signal STB-A is "off" and STB-B is "on." The analog switches discharging the divider are now "off" and the STB-B signal activates the analog switch in U5', which connects five volts to the capacitor divider, thus charging the capacitors. In the third step, STB-B remains on (due to the flip flop) and STB-C is "on."

A buffer amplifier, U6, is connected to the junction of the capacitive divider and its output is connected to one of the analog switches of U5. This switch is activated by STB-C which samples the voltage and stores the value on C 4. The output is buffered by another amplifier. In the fourth step, STB-C is turned "off" and the flip-flop in U4 is reset, which deactivates STB-B. The whole process is then repeated.

The combination of the analog switch activated by STB-C, C4 and the buffer amplifier is called a sample and hold circuit. The output is a dc voltage which is proportional to the impedance of the capacitance of the devices 26, 28 to be measured.

The clock gates the output states, and the output of U3' is low only when U1' is low. As the outputs of U2' are changing, clock pulses from U1' hold U3' in the low or "off" state. When STB-A is high, this enables pins 5 and 6 of U5', which goes high and shorts C3 and the capacitance of devices 26, 28 to ground and discharges them.

When STB-B is high this causes U5 to supply the 5 volts $V_{cc}$ from pin 2 of U5' to C3 which is in series with the capacitance of devices 26, 28, thus forming a voltage divider which has the voltage therefrom applied to U6', which is a high-input impedance buffer providing a low impedance output to the comparator through terminals J3 and along line 26. U6', U5' and C4 form a sample and hold circuit; and, U6' drives J3 as a low impedance load without discharging C4. When STB-C is high, five volts is applied in pin 12 of U5' and U5' outputs to C4. STB-C is high when STB-B is high because U4' forms a set/reset latch. The next clock pulse toggles U2' to reset to 0,0. C4 is a storage element and stores the voltage generated by the force on the capacitive devices 26, 28 and thus provides an output proportional to the force. Referring to Table II, the states of the devices are shown for the four states 0,0, 0,1, 1,0 and 1,1 of U2'.

Figure 8:
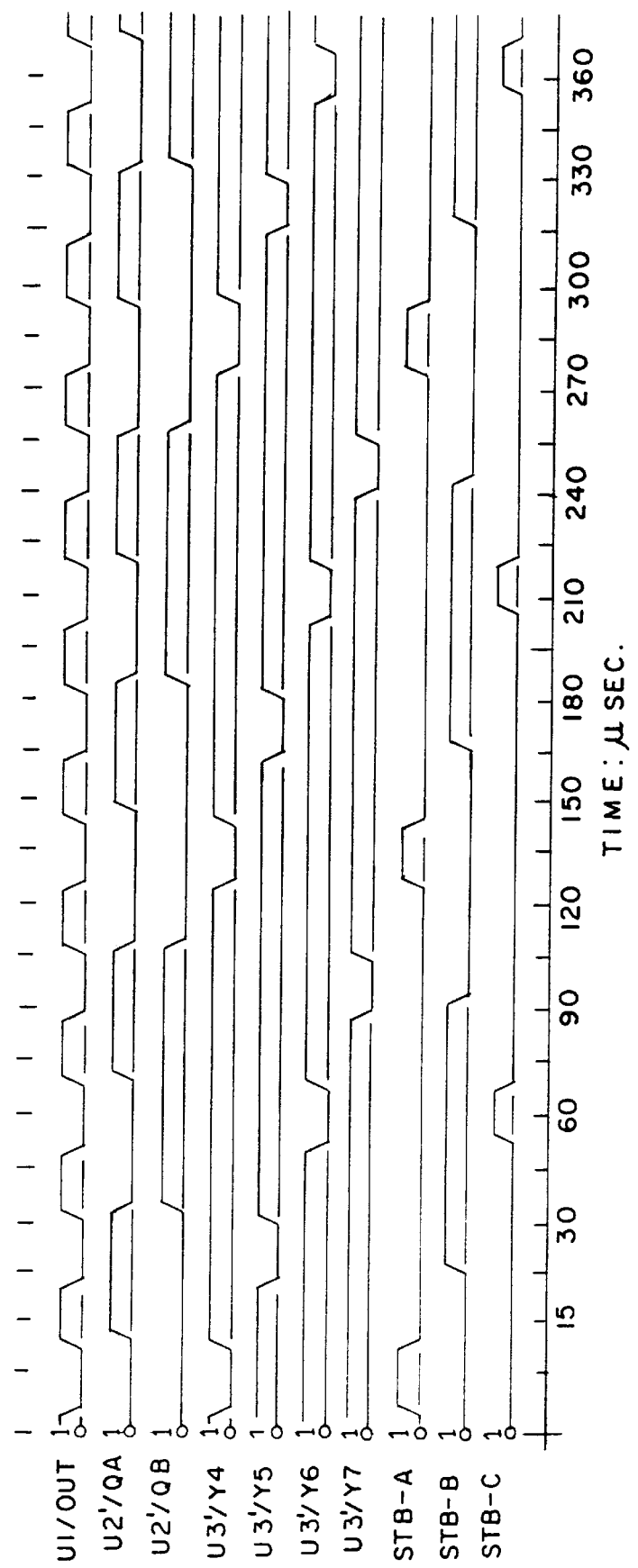
FIG. 8 is a timing diagram for the outputs of the various devices of the circuit of FIGS. 7a and 7b.

The timing of the outputs of the various devices of the circuit of FIGS. 7a and 7b is illustrated in graphical form in FIG. 8.

TABLE II (FIGS. 7a & 7b)

| U1' | U2' | U3' | U5' | STB-A | STB-B | STB-C |
|---|---|---|---|---|---|---|
| Lo | 0,0 | Y4 Lo | 5,6 Hi | Hi | Lo | Lo |
| Lo | 0,1 | Y5 Lo | 13 Hi | Lo | Hi | Lo |

TABLE II-continued (FIGS. 7a & 7b)

| U1' | U2' | U3' | U5' | STB-A | STB-B | STB-C |
|-----|-----|------|-------|-------|-------|-------|
| Lo | 1,0 | Y6 Lo | 12 Hi | Lo | Hi | Hi |
| Lo | 1,1 | Y7 Lo |  | Lo | Lo | Lo |

The values of capacitance resistance and the device type designations are given in Table III for the circuit of FIGS. 7a and 7b.

TABLE III (FIGS. 7a & 7b)

| R: Ohms | C: μfds | U: Type |
|---------|---------|---------|
| 1 - 10K, 5% ¼W | 1 - .001, 50 v | 1' - LM 555 |
| 2 - 10K, 5% ¼W | 2 - .01, 50 v | 2' - 74HC163 |
|  | 3 - 150 pf, 50 v | 3' - 74HC138 |
|  | 4 - .01, 50 v | 4' - 74HC00 |
|  | 5 - 10, 35 v | 5' - 74HC4066 |
|  | 6 - .1, 50 v | 6' - TLC272 |
|  | 7 - .1, 50 v |  |
|  | 8 - .1, 50 v |  |
|  | 9 - .1, 50 v |  |
|  | 10 - .1, 50 v |  |
|  | 11 - .1, 50 v |  |

The present invention thus provides a simple and effective relatively low cost technique for enabling the vehicle operator to control the rate or speed of raising or lowering of a vehicle-powered window lift by the amount of pressure or force the operator applies to the switch or rocker button, typically located on a console on the vehicle door. The user input device utilizes a pressure-responsive, variable-impedance switch or input device, which in one embodiment comprises a pressure-sensitive, variable-resistance device and, in another embodiment, comprises a pressure-responsive, variable capacitance.

Although the present invention has been described hereinabove with respect to the illustrated embodiments, it will be understood that the invention is capable of modification and variation and is limited only by the scope of the following claims.

We claim:

1. A variable-speed vehicle window power lift system comprising:
   (a) a force transducer responsive to increasing user finger pressure on an input member to provide a decreasing electrical impedance;
   (b) a signal generating circuit connected to an onboard vehicle power source and operative to produce a control signal indicative of said change in impedance;
   (c) a power amplifier circuit connected to an onboard vehicle power source and having its input connected to receive said control signal and operative to provide a power driver signal modulated according to said control signal;
   (d) a movable vehicle window including structure operative for guiding window movement; and
   (e) a bi-directional motor and a lift linkage connected to said window and driven by said motor, said motor operative upon said energization to lower and raise said vehicle window, wherein said motor is increased in speed as said user's finger pressure on said input member increases.

2. The system defined in claim 1, wherein said control signal is pulse width modulated.

3. The system defined in claim 1, wherein said window motor includes a bi-directional relay.

4. The system defined in claim 1, wherein said amplifier includes a Mosfet device.

5. The system defined in claim 1, wherein said force transducer includes a polymer film with carbon interspersed therein and said decreasing impedance comprises decreasing resistance.

6. The system defined in claim 1, wherein said decreasing impedance comprises generating increasing capacitance.

7. The system defined in claim 1, wherein said force transducer provides a decreasing resistance.

8. A method of varying the speed of raising and lowering a vehicle-powered window lift comprising:
   (a) guiding a vehicle window for movement in a generally vertical direction;
   (b) engaging said window with lifting structure;
   (c) connecting said lifting structure to an electrically energized motor;
   (d) providing a force transducer and decreasing the impedance thereof in response to increasing user-applied force thereto;
   (e) detecting changes in the impedance of said transducer;
   (f) generating an electrical control signal indicative of said changes in impedance; and
   (g) modulating a driver signal with said control signal and applying said driver signal to said motor and energizing said motor and varying the motor speed according to the level of modulation of said driver signal.

9. The method defined in claim 8 wherein said step of energizing said motor includes latching said motor "on" at maximum speed when said impedance is decreased below a predetermined threshold.

10. A variable speed vehicle window power lift system comprising:
    (a) a force transducer responsive to increasing user manual pressure on an input member to provide a decreasing electrical impedance;
    (b) circuit means connected to an onboard vehicle power source and operative to produce a control signal indicative of said decreasing impedance;
    (c) a power switching circuit connected to an onboard vehicle power source and having its input connected to receive said control signal and operative to provide a power signal modulated according to said control signal;
    (d) a moveable vehicle window including structure operable for guiding window movement;
    (e) a bi-directional motor and lift linkage connected to said window and driven by said motor, said motor operative upon energization by said power signal to lower and raise said vehicle window, wherein said motor is increased in speed as said user's manual pressure on said input member increases; and,
    (f) timing means operative to latch said motor "on" at maximum speed when said impedance is decreased below a predetermined threshold.

11. The system defined in claim 10 wherein said timing means is operative to latch said motor "on" for a predetermined time period.

* * * * *